United States Patent [19]
Adlerstein

[11] Patent Number: 5,144,413
[45] Date of Patent: Sep. 1, 1992

[54] SEMICONDUCTOR STRUCTURES AND MANUFACTURING METHODS

[75] Inventor: Michael G. Adlerstein, Wellesley, Mass.

[73] Assignee: Raytheon Company, Lexington, Mass.

[21] Appl. No.: 734,069

[22] Filed: Jul. 22, 1991

Related U.S. Application Data

[60] Continuation of Ser. No. 323,101, Mar. 14, 1989, abandoned, which is a continuation-in-part of Ser. No. 918,646, Oct. 14, 1986, abandoned, which is a continuation of Ser. No. 740,707, Jun. 3, 1985, abandoned, which is a division of Ser. No. 323,781, Nov. 23, 1981, Pat. No. 4,536,469.

[51] Int. Cl.⁵ .......................................... H01L 23/02
[52] U.S. Cl. ...................................... 357/81; 357/56; 357/69; 357/80
[58] Field of Search ..................... 357/81, 56, 68, 69, 357/75, 80

[56] References Cited

U.S. PATENT DOCUMENTS

| | | | |
|---|---|---|---|
| 3,689,993 | 9/1972 | Tolar | 357/68 X |
| 3,748,546 | 7/1973 | Allison | 357/69 X |
| 3,761,783 | 9/1973 | Kroger et al. | 357/81 |
| 3,872,496 | 3/1975 | Potter | 357/81 |
| 3,908,185 | 9/1975 | Martin | 357/81 |
| 3,932,226 | 1/1976 | Klatskin et al. | 357/75 X |
| 4,197,551 | 4/1980 | Adlerstein | 357/81 |
| 4,231,058 | 10/1980 | Gleason | 357/56 |
| 4,319,265 | 3/1982 | Rosen et al. | 357/75 X |
| 4,339,870 | 7/1982 | Ball et al. | 357/56 |

FOREIGN PATENT DOCUMENTS

1290926 9/1972 United Kingdom .

OTHER PUBLICATIONS

DiLorenzo, J. V., Niehaus, W. C., Velebir, Jr., J. R., and Iglesias, D. E., "Beam-Lead Plated Heat Sink...," *IEEE Transactions on Electron Devices*, Aug. 1975, pp. 509–514.

Guditz, E. A., and Burke, R. L., "Multichip Integrated Circuit Memory..." *IEEE Transactions on Parts, Hybrids, and Packaging*, Jun. 1975, pp. 89–96.

Primary Examiner—Andrew J. James
Assistant Examiner—Sara W. Crane
Attorney, Agent, or Firm—Richard M. Sharkansky

[57] ABSTRACT

A plurality of microwave semiconductor devices is provided by plating a thin heat sink layer on a surface of a wafer of semiconductor material, masking selected portions of the heat sink layer, and plating unmasked portions of the heat sink layer to form a support layer. Substantial portions of the semiconductor material are removed to form a plurality of mesa shaped diodes, at least one semiconductor mesa shaped diode being formed in each region of the semiconductor material disposed on the masked portions of the heat sink layer. Thus each mesa shaped diode, or sets of mesa shaped diodes, has formed on one surface thereof a thin heat sink layer while the mesa shaped diodes are supported by the support layer for subsequent processing. Upper electrodes for the diodes are formed interconnecting the mesa shaped diodes. The individual diodes, or sets thereof, are then separated from the support structure to provide individual single diode, or multiple diode devices.

5 Claims, 9 Drawing Sheets

BEAM LEAD PATTERN 84

SEMICONDUCTOR STRUCTURES AND MANUFACTURING METHODS

This application is a continuation of application Ser. No. 323,101 filed Mar. 14, 1989, abandoned, which is continuation-in-part of application Ser. No. 918,646, filed Oct. 14, 1986, abandoned, which is a continuation of Ser. No. 740,707, filed Jun. 3, 1985, abandoned, which is a division of Ser. No. 323,781, filed Nov. 23, 1981, now U.S. Pat. No. 4,536,469.

BACKGROUND OF THE INVENTION

This invention relates generally to semiconductor devices and more particularly to semiconductor devices adapted to operate with high levels of microwave power.

As is known in the art, it is frequently desirable to use microwave diodes in a variety of high power applications. When used in such applications the diode may be mounted to a pedestal shaped heat sink used to extract heat from the diode. Further, in the fabrication of individually mesa shaped diodes, prior to dicing the wafer into individual diodes a wafer used to form such diodes has disposed on the entire back surface thereof a thick plated heat sink. After separating the diodes this thick plated heat sink is mounted to the pedestal shaped heat sink. When the material of the pedestal heat sink has a higher thermal conductivity than the material of the thick plated heat sink forming part of the mesa shaped diode, it is desirable to minimize the thickness of the thick plated heat sink in order to minimize the thermal resistance of the diode. However, a thick plated heat sink generally is required to provide structural integrity to the wafer after the diodes have been formed into mesas. This is because after mesa definition, the wafer of mesa shaped diodes is supported only by the gold plated heat sink structure and further photolithographic steps and processing steps are still generally required after the mesa definition. Therefore, if the heat sink is too thin the structure supporting the mesa shaped diodes may flex, bend, or crease making it difficult to handle during the additional photolithographic and processing steps, thus resulting in lower device yields.

As also known in the art, a critical step in the assembly of microwave power diodes is the step of mounting the diode in a microwave package and the subsequent interconnection of the diode to the package terminals. Generally, the interconnection is accomplished by soldering the plated heat sink into the package to form a first contact and using a wire preform attached to the top of the mesa shape diode as a second contact. The wire preform is typically ultrasonically bonded to the top of the mesa shaped diode. This packaging technique has several short comings, however, particularly when applied to millimeter wave diodes. The mesas shaped millimeter wave diodes are comparatively small and fragile compared to X-band diodes, for example. This imposes several contraints on the bonding operations and the preform lead wires: bonding forces and ultrasonic power must be kept to a minimum, often producing a bond of questionable strength, bonding tool diameters must be small in order to avoid excessive force on the mesas tops and damage by off center bonds, and lead preforms are difficult to precisely shape leading to unpredictable package parasitics, resulting in degraded device performance. Moreover, lead bonding is a costly and time consuming process requiring a high degree of bonding operator skill.

As is also known in the art, it is frequently desirable to use a plurality of individual mesa-shaped diodes with the mesa shaped diodes having a total area equal to an equivalent single mesa shaped diode. A plurality of individual diodes adapted to operate at X-band may be individually mounted in a package. However when the diodes are designed to operate at multimeter wavelengths, for example, their size is so small that mounting them individually to provide a plurality of diodes in such a package is difficult.

SUMMARY OF THE INVENTION

In accordance with the invention a wafer including a plurality of mesa shaped diodes, each having a thin plated heat sink attached to one surface thereof, is supported, for metallization processing by a thicker support structure having a plurality of apertures, such apertures defining the areas of the thin plated heat sink. After metallization and subsequent dicing each diode device has a relatively thin plated heat sink. The diode device thus will have a lower thermal resistance than diode devices having thicker plated heat sinks, a feature particularly desirable when the diode device is mounted on a material having a higher thermal conductivity than that of the plated heat sink. The support structure provides the necessary structural integrity to the plurality of mesa diodes for the metallization processing. In addition, the apertures provided in the thick support may be used to align a dicing mask used for dicing the wafer into individual mesa shaped diode devices.

In accordance with the invention a multi-mesa shaped diode device is provided having an upper electrode formed by depositing a layer of photoresist over top surfaces of the diodes forming a plurality of apertures in the photoresist layer aligned with the top surfaces of the mesa shaped diodes, substantially levelling the photoresist layer to the top surfaces of the mesa shaped diodes, providing a layer of an adherent material on the photoresist layer, and providing a layer of a conductive material on the adherent layer. A plurality of apertures having a diameter smaller than the corresponding diameter of the top surfaces of the mesa shaped diodes is formed through the adherent layer and layer of conductive material. A second layer of photoresist is then provided which defines an upper electrode pattern such as overlay or beam lead pattern. The electrode pattern is then plated directly to the top surfaces of the diodes thus forming the upper electrode pattern for the device. With such a structure a multi-mesa diode device having a top electrode pattern on a top surface thereof interconnecting each of the individual mesa shaped diodes is realized. The top electrode pattern provides support for the multi-mesa diode structure after dicing. During packaging, the top electrode pattern provides a lead pattern which can be made thicker, wider and heavier than that used with ultrasonically bonded preform leads thereby reducing the series, resistance and inductance of the diode. Further a multidiode device adapted to operate at multimeter wavelengths may be easily packaged since the plurality of diodes are integrally formed as a single device.

In accordance with the invention a multimesa diode device having a thin heat sink attached to one surface of each mesa shaped diode and an upper electrode attached to a second surface thereof is provided by: plating a heat sink layer on a surface of a wafer of semiconductor material; masking selected portions of the plated heat sink layer; and plating the unmasked portions of the layer to increase the thickness thereof to provide a support layer. A plurality of multimesa diodes are formed in regions of the semiconductor material disposed on the masked portions of the plated heat sink layer. Upper electrodes used to support the multimesa diode of the device after dicing of the wafer are provided by: depositing a layer of photoresist on the heat sink layer and the mesa shaped diodes; providing apertures in the photoresist layer; levelling the photoresist layer to the mesa tops; providing a metalization layer on the photoresist layer; and providing a plurality of undersized apertures in the metalization layer aligned with the mesa tops. A second layer of photoresist is then provided on the metalization layer and is patterned to expose portions of the metalization layer. The upper electrodes are then plated directly onto portions of the metalization layer exposed by the photoresist layer. The photoresist layers and metalization layer are removed and the multimesa diode devices are diced apart. With such an arrangement a multimesa diode device is provided with a thin heat sink on one surface and a top electrode on the second surface. The thermal transfer advantages of the multimesa diode device are thus realized without the packaging and handling difficulties generally associated with individual diodes.

BRIEF DESCRIPTION OF THE DRAWINGS

For a better understanding of the invention, reference is made in the following detailed description to the drawings wherein.

DESCRIPTION OF THE PREFERRED EMBODIMENTS

Figures 1, 2, 3:
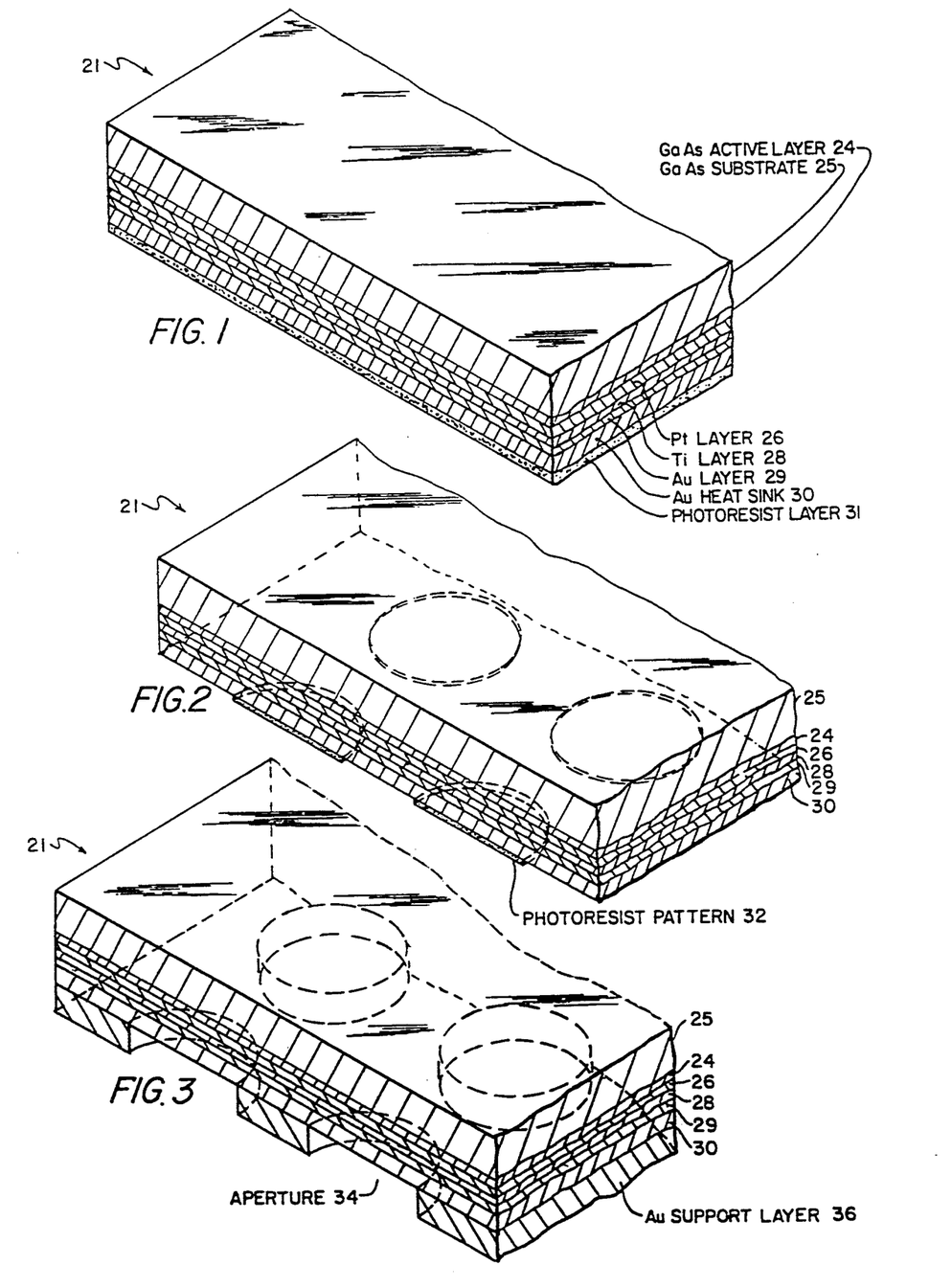
FIGS. 1-4 are a series of fragmentary isometric cross-sectional views showing steps in the construction of single mesa shaped diode device having a thin heat sink layer in accordance within the invention.

Construction of semiconductor devices having thin heat sink layers in accordance with the teachings of the present invention will be described in conjunction with the isometric cross-sectional views of FIGS. 1 through 4. Referring first to FIG. 1, a substrate 25, here conductive gallium arsenide (GaAs), is shown to include an active layer 24 of epitaxially grown semiconductor GaAs. Active layer 24 may have one of many different doping density profiles depending upon the particular application for the diode. Here, for example, a doping density profile for an IMPATT diode as described in my U. S. Pat. No. 4,160,992 issued Jul. 10, 1979 and assigned to the assignee of this invention is used. A first metal layer 26, here of platinum (Pt), is sputtered upon the active layer 24 to a thickness in the range of 100 Angstroms to 200 Angstoms (A). A second metal layer 28, here of titanium (Ti), is then sputtered over the platinum layer 26 to a thickness of 1000 A to 2000 A. Titanium is the preferred material although tungsten, hafninum, or other refractory metals may be used for layer 28. Upon the layer 28 a 1000 A to 2000 A thick layer 29 of highly conductive gold is evaporated, forming the lower contact for the diode device. Next, a thermally and electrically conductive heat sink layer 30, here of gold one to two microns thick, is plated over evaporated gold layer 29. A layer 31 of photoresist is then deposited on the plated gold layer 30, as shown.

Referring now to FIG. 2, the photoresist layer 31 is masked, developed, and chemically etched away in selective areas using well known photoresist techniques, to leave portions 32, thereof, remaining over selected regions of the plated gold heat sink layer 30, as shown.

Now referring to FIG. 3, a support layer 36 is formed by plating the unmasked portions of the thin heat sink layer 30 with gold, here to a thickness of ten microns. The regions 32 (FIG. 2) of photoresist layer 31 are removed leaving an apertured support layer 36. It is noted that the heat sink layer 30 remains at the original thickness but the support layer 36 is made sufficiently thick to provide structural integrity for the diodes to be formed in wafer 21 in a manner to be discribed hereinafter. Suffice it to say here, however, that the support layer 36 has formed therein a plurality of apertures 34 corresponding to areas where the photoresist pattern 32 (FIG. 2) was provided. The plurality of apertures 34 define the areas of the thin plated heat sink layer 30.

Figures 4, 5C:
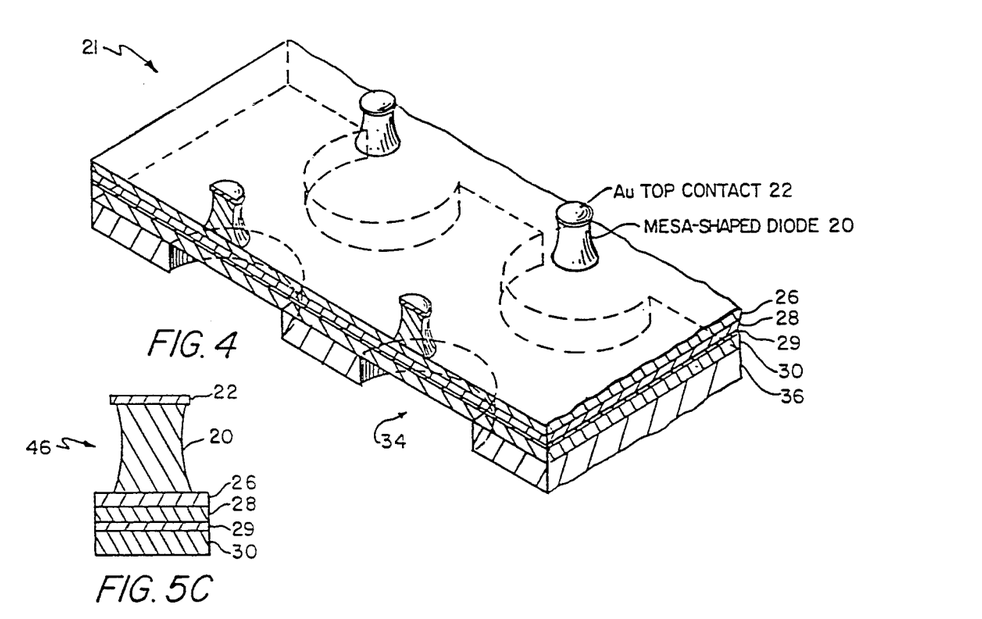
FIG. 5C is a cross-sectional view of a mesa shaped diode having a heat sink in accordance with the invention.

Referring now also to FIG. 4, the substrate 25, is thinned to a predetermined thickness, a plurality of top contacts 22 are provided on the top of the thinned substrate 25 and a plurality of mesa shaped diodes 20 are formed from the thinned substrate 25 and active layer 24 between the top contact 22 and platinum layer 26, as shown. The plurality of top contacts 22 are formed by first depositing a photoresist layer (not shown) on the thinned substrate 25. The photoresist layer is masked, developed, and chemically etched away in predetermined locations using well-known photoresist techniques leaving a plurality of here circular apertures on the photoresist layer (not shown). Each circular aperture (not shown) is precisely aligned with a corresponding one of the plurality of apertures 34 in the thick gold plated support 36. The circular apertures (not shown) are then plated with gold forming the previously mentioned top contacts 22. The alignment for the top contacts 22 to the apertures 34 is realized by a front to back alignment step of the top contact mask (not shown) used to provide the photoresist pattern for the circular gold contacts 22. A general front to back alignment procedure is described in U.S. Pat. No. 4,169,992, previously mentioned. The plurality of mesas diodes 20 are formed between the top contacts 22 and the platinum layer 26. The mesa diodes 20 are formed by providing a pattern in photoresist on the thinned substrate 25, using well known photoresist techniques. The alignment of the mesa forming mask (not shown) used in forming the pattern for the mesa diodes 20 is realized by the front to back alignment technique as described in U.S. Pat. No. 4,169,992, referred to above. After mask alignment, the mesa diodes 20 are formed by chemically etching away portions of the thinned substrate 25 and active layer 24 between the the top contact layer 22 and the platinum layer 26, as shown. Thus mesa diodes 20 formed from the thinned substrate 25 and active layer 24 are supported by the support layer 36.

Figure 5A:
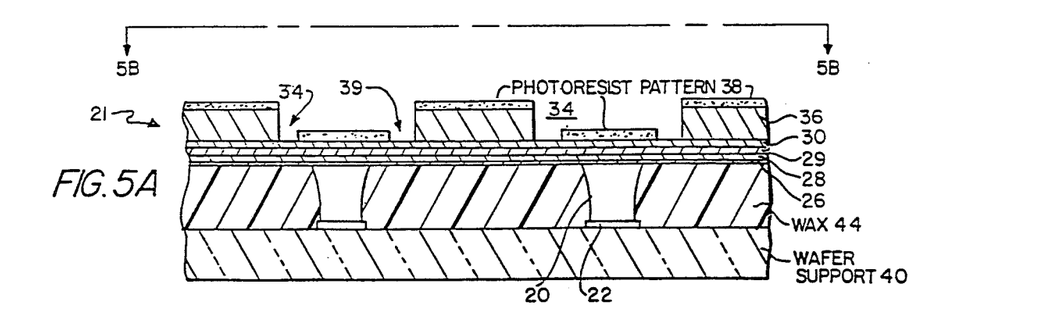
FIG. 5A is a cross-sectional view useful in understanding a dicing operation of a wafer of diodes having the thin heat sink layer provided in accordance with FIGS. 1-4.
Figure 5B:
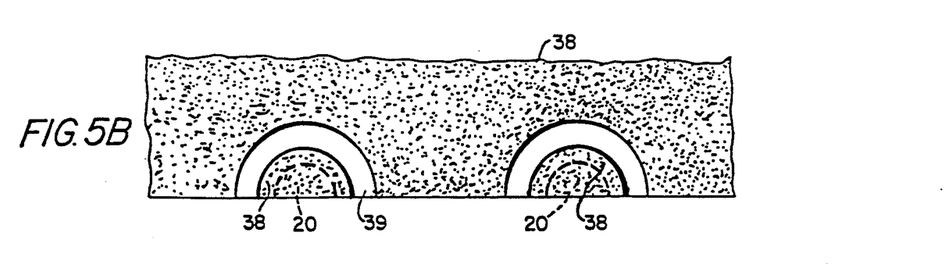
FIG. 5B is a top view of the cross-sectional view of FIG. 5A showing the photoresist pattern used in the dicing step.

Referring now to FIGS. 5A and 5B, the wafer 21 having a plurality of mesa diodes 20 is mounted on a wafer support 40 with a non-reactive wax 44 filling the space between and around mesa diodes 20 and gold contacts 22, as shown. The wafer 21 with the wax protected mesa diodes 20 is pressed against the upper surface of support 40. A photoresist layer is deposited on the plated support layer 36 of the wafer 21. A dicing mask (not shown) is provided on the plated support layer 36 of the wafer 21, and using well known photoresist techniques, a dicing pattern 38 of photoresist is produced. The apertures 34 in the thick plated support layer 36 are here used to align the dicing mask. The diodes 20 are diced from the wafer 21 within regions 39 provided in the dicing pattern 38 of photoresist. The wafer 21 is placed in a spray etching system of a type described in U.S. Pat. No. 4,160,992 mentioned previously. The spray etch system (not shown) provides an etchant (not shown) which completely etches through the exposed portions 39 of layers 30, 29, 28 and 26 to separate the diode devices from the thick support layer 36. After dicing, the individual diode devices 46 an exemplary one thereof being shown in FIG. 5C, may be collected and cleaned using any well known technique.

Figure 6:
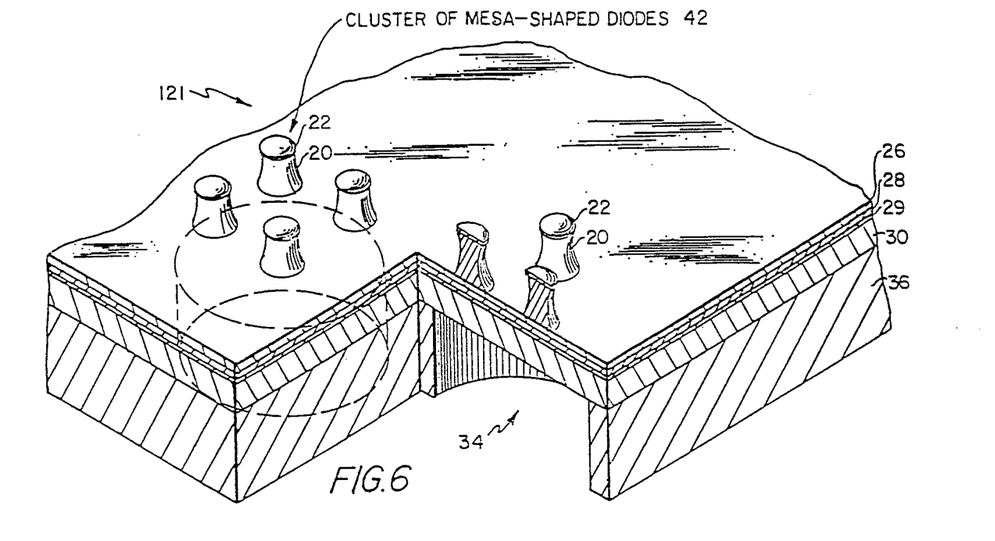
FIGS. 6-8 are a series of fragmentary isometric partially broken away views showing steps in the construction of a multimesa diode device having a thin heat sink layer and beam leads.

Referring now to FIG. 6, a wafer 121, includes a plurality of clusters, or sets, of mesa shaped diodes 42 (each cluster of mesa diodes 42 having a total area equal to a single mesa diode equivalent) formed over a corresponding plurality of apertures 34 provided by the thick plated support 36, as shown. The wafer 121 is formed in a similar manner as wafer 21 shown in FIG. 4 except during mesa definition a cluster mask (not shown) is provided to produce a pattern in a layer of photoresist corresponding to a plurality of clusters of mesa diodes. This cluster mask (not shown) is front to back aligned as explained in U.S. Pat. No. 4,160,992, previously mentioned. The plurality of the clusters of mesas diodes 42 are formed by chemically etching away portions of the substrate 25 between the top contact layer 22 and the platinum layer 26, as previously explained.

Figure 7:
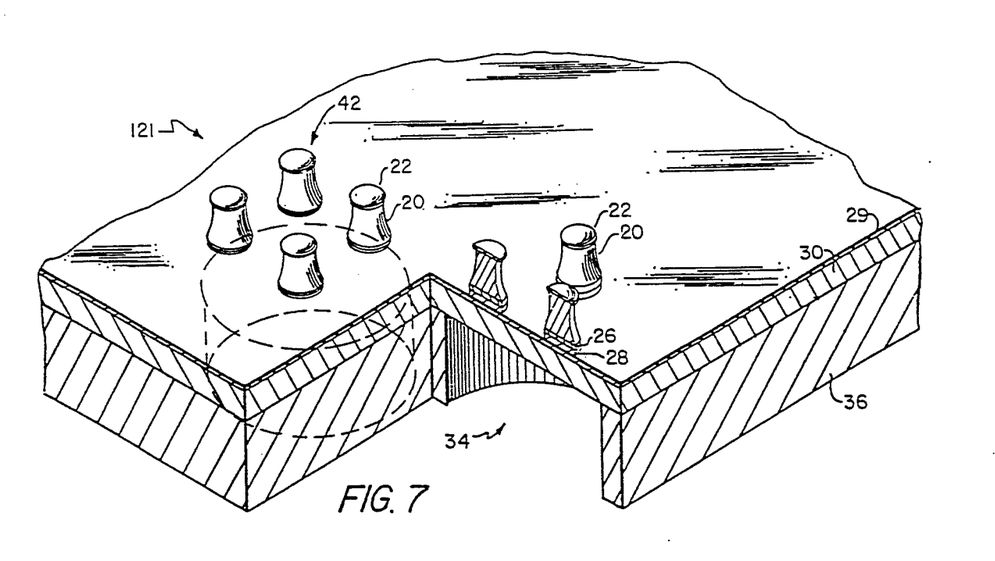

Now referring to FIG. 7, the wafer 121 is placed in a sputter etching system (not shown) and portions of the layer 26 of platinum unmasked by the diodes 20 are removed. A chemical etch here a two percent solution of hydrofloric acid (2% $HF:H_2O$) is then used to remove portions of layer 28 unmasked by diodes 20. The wafer 121 at this point has the layer 26 of platinum and the layer 28 of titanium removed in all areas except for those areas forming part of the individual mesa diodes 20 of each cluster of mesa diodes 42, leaving fold layer 29 exposed on the mesa diode side of the wafer 121. Exposing gold on the mesa diode side of wafer 121 is used to particular advantage in a dicing operation to be described in conjunction with FIG. 8 and FIG. 9.

Figures 8, 9:
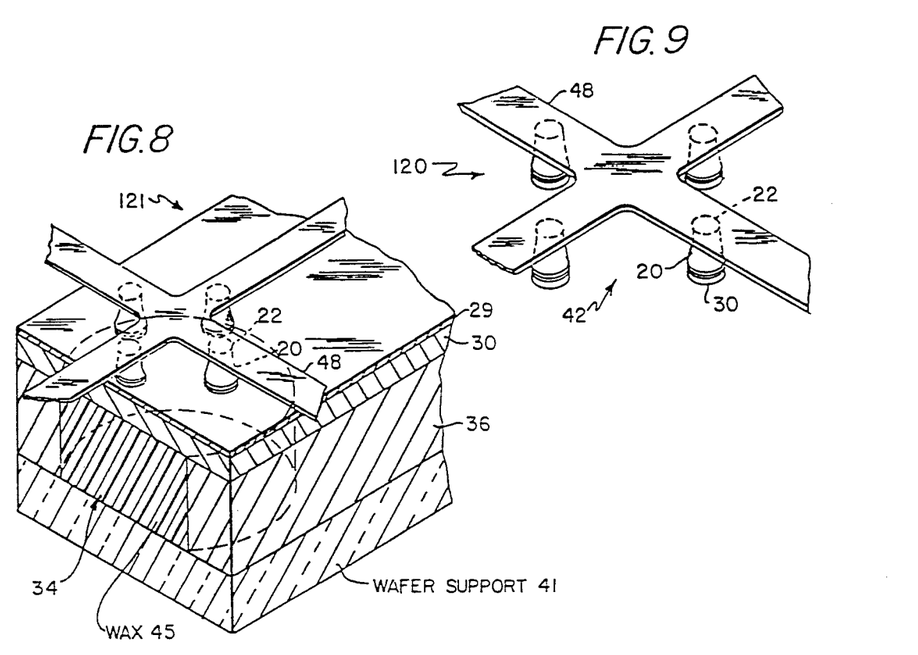
FIG. 9 is a isometric view of a multimesa diode device constructed in accordance with FIGS. 6-8 having thin heat sink layer and beam leads.

Now referring to FIG. 8 and FIG. 9, beam leads 48 are here shown attached to the cluster of mesa diodes 42 for reasons to be described in connection with FIGS. 16-17. Suffice it to say here, however, that the thick plated support layer 36 is used to support the individual mesa diodes 20 at this stage in the processing while the attached gold plated beam leads 48 provide support for the individual mesa diodes 20 during and after the dicing operation. As shown in FIG. 8, gold is exposed on the upper surfaces of the wafer 121. A layer of wax 45 is here provided on the bottom side of the wafer 121, completely filling in the apertures 34 of the gold plated support layer 36. The wafer 121 and wax layer 45 are supported by a wafer support 41. Since gold is exposed on both sides of the wafer 121 a gold etching solution is here used to etch from the mesa diode side of the wafer with the plated heat sink side mounted down. Here, the wafer 121 is placed in a conventional emersion bath of etchant (not shown). The etchant flows o the mesa side of the wafer 121, but substantially below the tops of the multi-mesa diode device 120, and thus the etchant does not attack the beam leads 48. This technique uses the mesa shaped diodes 20 themselves as a mask during the dicing procedure. Since the gold layers 29, 30 exposed on the mesa diode side within the aperture 34 of the thick gold plated support layer 36 are substantially thinner than other exposed gold areas, the portions of the gold in layers 29, 30 disposed over the aperture 34 will etch away before other gold areas of the diode cluster 42 are significantly disturbed thus forming clusters, or sets, of here four diodes in each device 120 as shown in FIG. 9.

Figure 10:
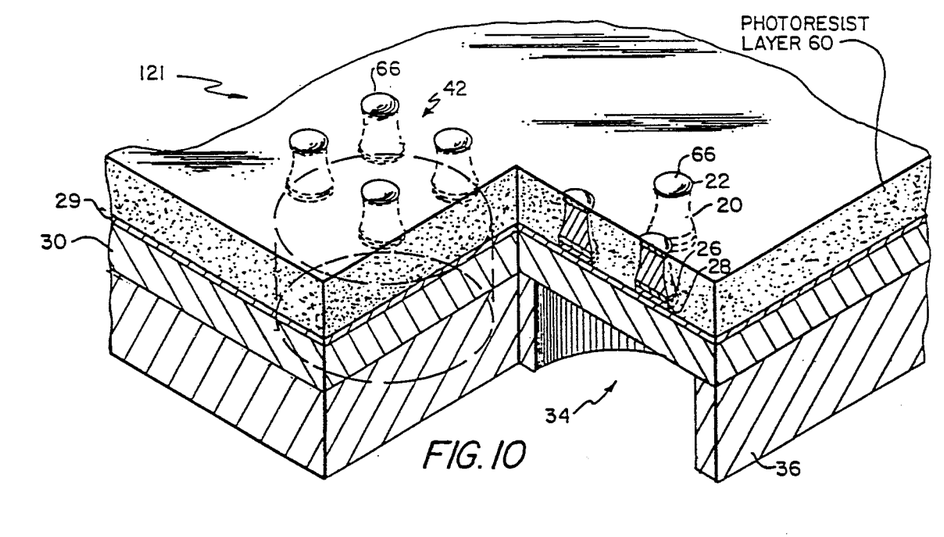
FIG. 10 is a fragmentary isometric partially broken away view showing the diode cluster of FIG. 7 with a first layer of photoresist used in fabricating interconnect patterns in accordance with the invention.

Referring now to FIG. 10, a wafer 121' will be processed in accordance with an alternative embodiment of the invention. Thus, wafer 121' is shown in FIG. 10 at an equivalent stage of processing as the wafer 121 shown in FIG. 7, however here wafer 121' is provided with a first thick layer of photoresist 60, as shown. A plurality of apertures 66 aligned with the mesa top contacts 22 are formed in the photoresist 60 to exposure the top contacts 22 using well known photoresist techniques. The photoresist layer 60 is then levelled with the top contacts 22 by conventional techniques such as controlled light exposure or mechanical lapping.

Figure 11:
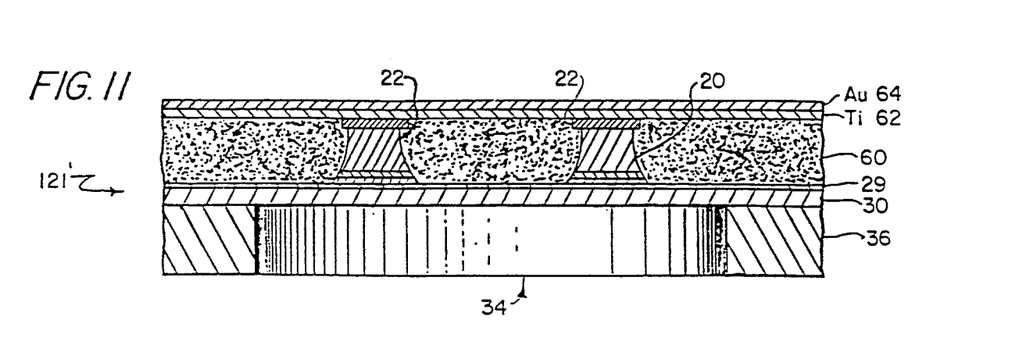
FIGS. 11-13 are a series of cross-sectional views showing steps in the construction of the interconnect patterns.

Referring now to FIG. 11, an adherent layer 62 here of titanium, approximately 200 A thick is sputtered over the top of the wafer section 121'. Other metals such as molybedenum, nickel, nickel-chrome and similar metals or metallic systems may be used for the adherent layer 62. A conductive layer 64 here a 200 A thick layer of gold is sputtered over the adherent layer 62 of titanium. Other conductive metals such as platinum, silver and copper may be used for conductive layer 64. The preferred combination, however, is titanium-gold, because this combination provides a contact system virtually alloyless and is not subject to loss of adhesion. The adherent layer 62 is sputtered within the apertures 66 (FIG. 10) formed in the photoresist 60. The adherent layer 62 provides a contact layer interconnecting the individual diodes 20 (FIG. 10) in each cluster of diode 42 (FIG. 2).

Figure 12:
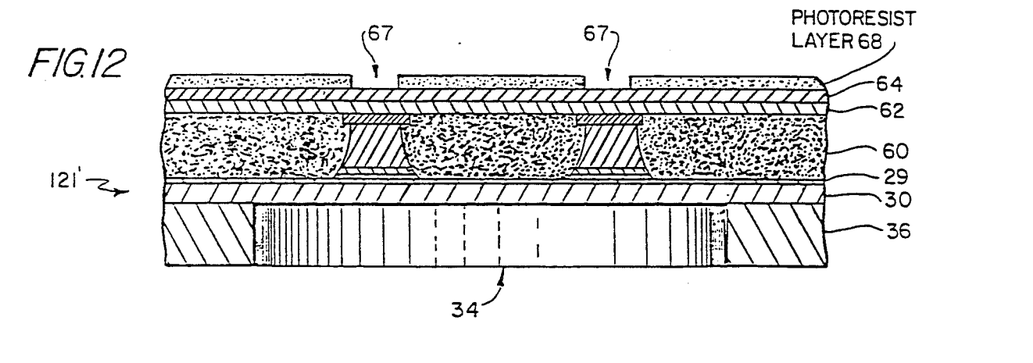

Now to referring to FIG. 12, the wafer 121' is provided with a second layer 68 of photoresist. The layer 68 of photoresist is masked, developed, and etched away in selective areas using well known photoresist techniques to provide a pattern in the photoresist layer 68 of a plurality undersized circular aperatures 67 aligned to the diode top contacts 22.

Figure 13:
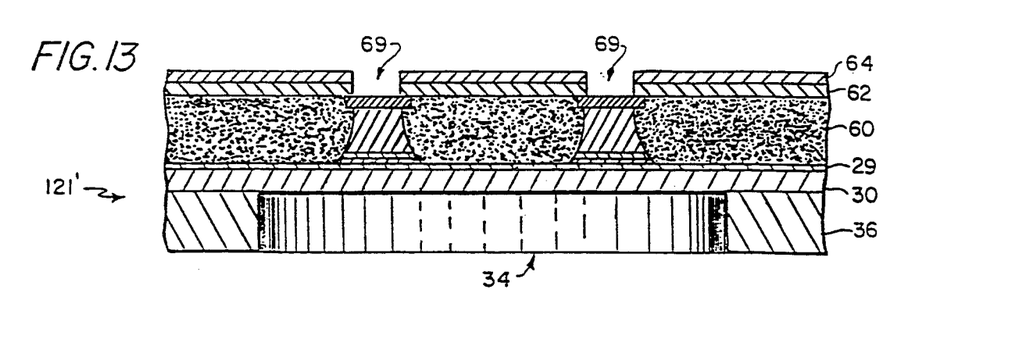

Referring now to FIG. 13 the first layer 62 and the second layer 64 are selectively removed from the mesa tops 22, within each of the apertures 67 formed in the photoresist layer 68. A plurality of apertures 69 are thus formed in layers 62 and 64. A thin layer of the first layer 62 and the second layer 64, thus remain attached to the edges of the mesa tops 22, because the apertures 69 are smaller than the mesa diode top contacts 22. The wafer 121' at this stage of processing may be provided with either a plurality of top electrode contacts such as the overlays shown in FIG. 15 or the beam leads shown in FIG. 17. Selection between the gold overlay pattern (FIG. 15) or the beam lead pattern (FIG. 17) is here primarily determined by the physical size of the mesa diodes. For example, for X band quadramesa diodes where the mesas are relatively large in comparison to millimeter wave mesas, the use of a beam lead interconnect is here impractical. This is because on a given wafer of semi-insulating material such as GaAs as used here, relatively few beam lead devices can be manufactured for X-band diodes due to the relatively long lengths of the beam leads in relation to the size of the mesa diodes. Here, the gold overlay structure is provided to interconnect the quadramesas X-band diodes to provide a more efficient interconnection scheme and thus a more efficient utilization of the area of the wafer 121'. However, for millimeter wave quadramesa diodes having relatively small mesas compared to X-band mesa diodes, a dense pattern of beam leads is plated to the mesa diodes to provide the interconnect portion for the mesa diodes. Fabrication of beam leads diodes are described in conjunction with FIGS. 16 and 17.

Figure 14:
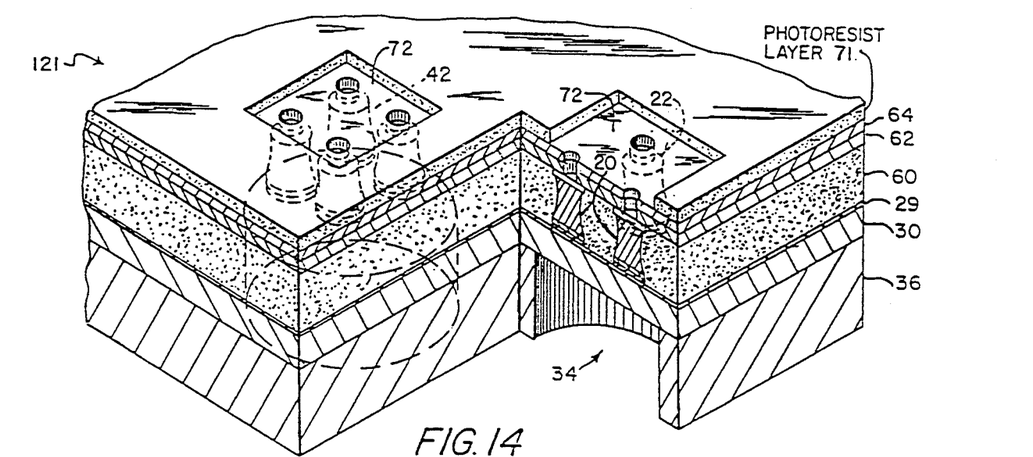
FIGS. 14-15 are a series of fragmentary isometric partially broken away views showing the steps in the construction of an overlay in accordance with the invention on a wafer at the stage of processing shown in FIG. 13.
Figure 15:
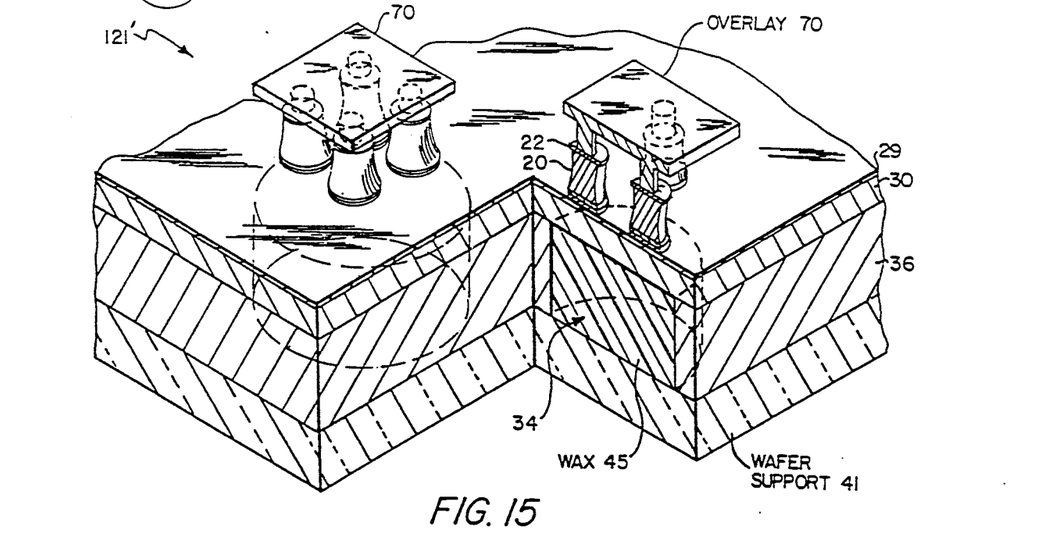

Referring now to FIGS. 14 and 15 fabrication of an overlay 70 (FIG. 15) for interconnecting each mesa diode 20 of the cluster of mesa diode 42 in accordance with the invention will now be described. Referring first to FIG. 14, a wafer 121' in the same stage of fabrication as that shown in FIG. 13, is provided with a layer of photoresist 71. The photoresist layer 71 is deposited on the second layer 64 and is masked, developed and etched away in selective locations using well known photoresist techniques to form a plurality of apertures 72.

Figure 15A:
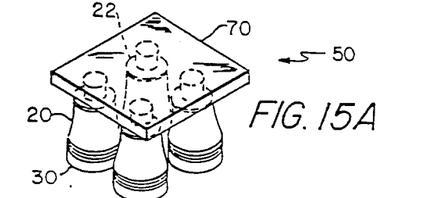
FIG. 15A is a isometric view of a plurality of diodes interconnected by a overlay in accordance with the invention.

Referring now to FIG. 15, the gold overlay 70 is plated to a thickness of here four microns within the areas exposed by the apertures 72. These overlays 70 interconnect each of the diodes 20 within each of the plurality of clusters of diodes 42. Further the overlay provides the support for each diode 20 of the cluster of diodes 42, after dicing. The overlay pattern 70 may be plated to any desired thickness, typically however, the thickness is in the range of four microns to ten microns. After plating the titanium layer 62, the gold layer 64, the thick photoresist layer 60, and the photoresist pattern 72 are removed from the wafer by conventional means leaving the wafer, as shown. Since gold is exposed on both sides of the wafer 121', a gold etching solution is here used to etch from the mesa diode side of the wafer 121'. The emersion etching technique described in conjunction with FIG. 8 is here used to dice the wafer 121'. Thus, the quadramesa diodes interconnected by the gold overlay 70 are used as a mask during the dicing operation. Since gold exposed in the region of the aperture 34 of the thick plated support 36 is substantially thinner than other exposed gold areas the gold in the region of the aperture 34 will etch through before other gold areas of the cluster of mesa diodes 42 or the gold overlay 70 are significantly disturbed thereby forming four diode devices, an exemplary one thereof, here device 50, as shown in FIG. 15A.

Figures 16, 17A:
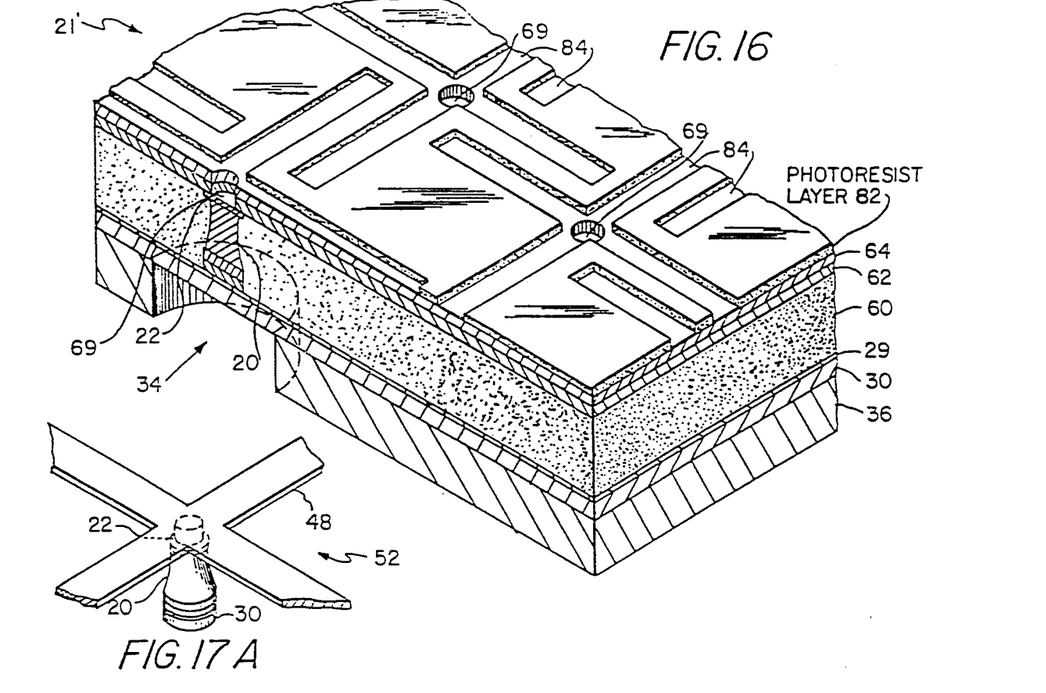
FIGS. 16-17 are a series of fragmentary isometric partially broken away views showing the steps in the construction of beam leads, for a single mesa diode device in accordance with the invention.
FIG. 17A is an isometric view of a diode device having a beam lead pattern in accordance with the invention.
Figure 17:
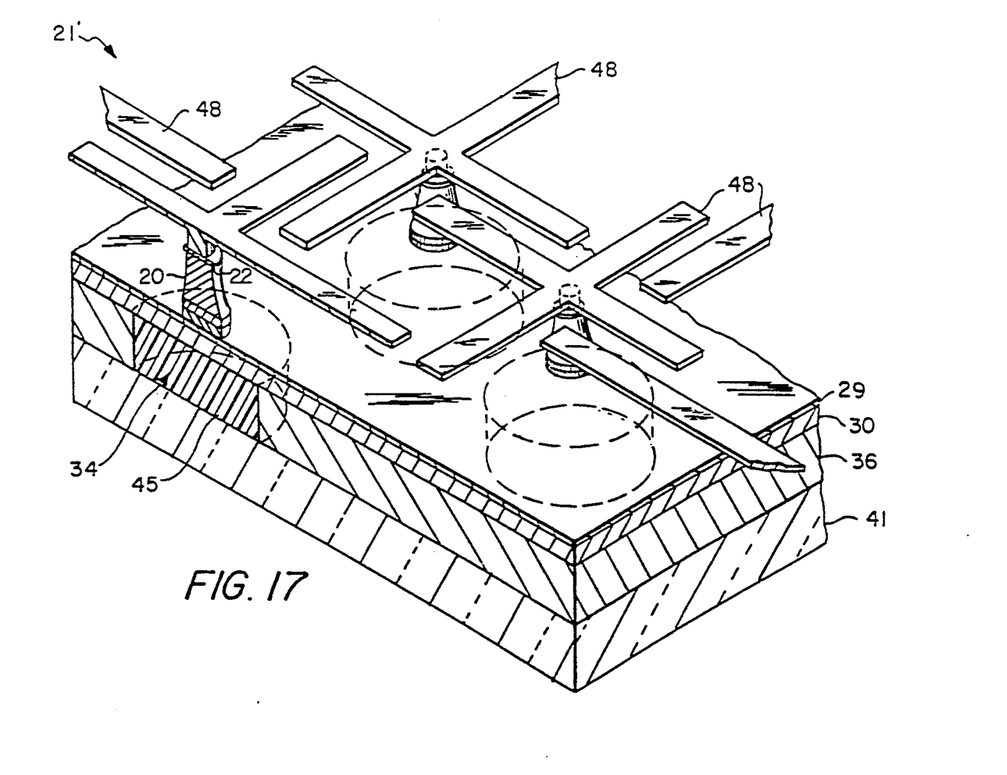

Fabrication of mesa diodes having plated beam leads 80 is next described in conjunction with FIG. 16 and FIG. 17. Referring first to FIG. 16 a wafer section 21', in the same stage of construction as that shown in FIG. 13, includes a plurality of individual diode elements 20, as shown. The wafer 21' now is provided with a second layer 82 of photoresist. This photoresist layer 82 is disposed on the second layer 64, and is masked, developed and etched away in selective locations using well known photoresist techniques to form a pattern 84 for the beam leads.

Referring now also to FIG. 17 the beam lead pattern 84 is plated to the diodes 20 in the areas exposed within the photo-resist layer 82. The beam lead pattern may be plated to any desired thickness, typically however, the thickness is in the range of four microns to ten microns. The photoresist layer 82, titanium layer 62, the gold layer 64 and the thick photoresist layer 60 are then removed using well known techniques leaving the mesa diodes 20 with plated beam leads 48, as shown. Since gold is exposed on both sides of the wafer 21 a gold etching solution is here used to etched from the mesa diode side of the wafer 21 as previously explained in conjunction with FIG. 8 to separate the diodes into individual devices 52, and exemplary one thereof, here device 52, as shown in FIG. 17A.

Alternatively, the overlays 70 or the beam leads 48 may be formed on the diodes after the wafer has been diced, as explained in conjunction with FIG. 8. In this case, the wafer having been diced is still supported by a wafer support 41 and a wax layer 45 filling in the apertures 34 of the support 36, as shown in FIG. 15 and FIG. 17. The beam lead or overlay interconnect patterns are then formed as explained above, and the diodes with the plated interconnects are then dismounted from the wax 45. This provides a method whereby the interconnect structure is not exposed to the etchant used in the dicing operation, since the interconnect pattern is not present during the wafer dicing step.

Figure 18:
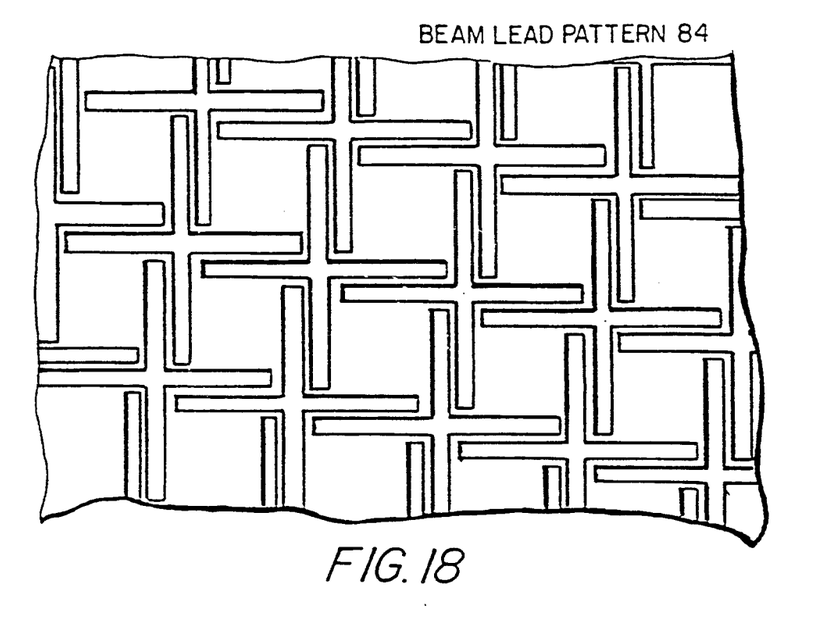
FIG. 18 is a top view of an interdigitated beam lead pattern.

Now referring to FIG. 18, a portion of a tightly packed beam lead pattern 84 which may be plated directly to an entire wafer provides a plurality of mesa diodes, as shown. This pattern is provided for interconnecting single mesa or multi-mesa diodes.

Referring again to FIGS. 8-9, the beam lead quadramesa diode 120 having the plated beam leads is formed in the same manner as the single mesa diode device 52 having plated beam leads, except for the use of a multimesa mask, for defining the diode mesas. The beam lead pattern as shown in FIG. 18 is here also used to provide the pattern of beam leads in photoresist for the multi-mesa diode.

Figure 19:
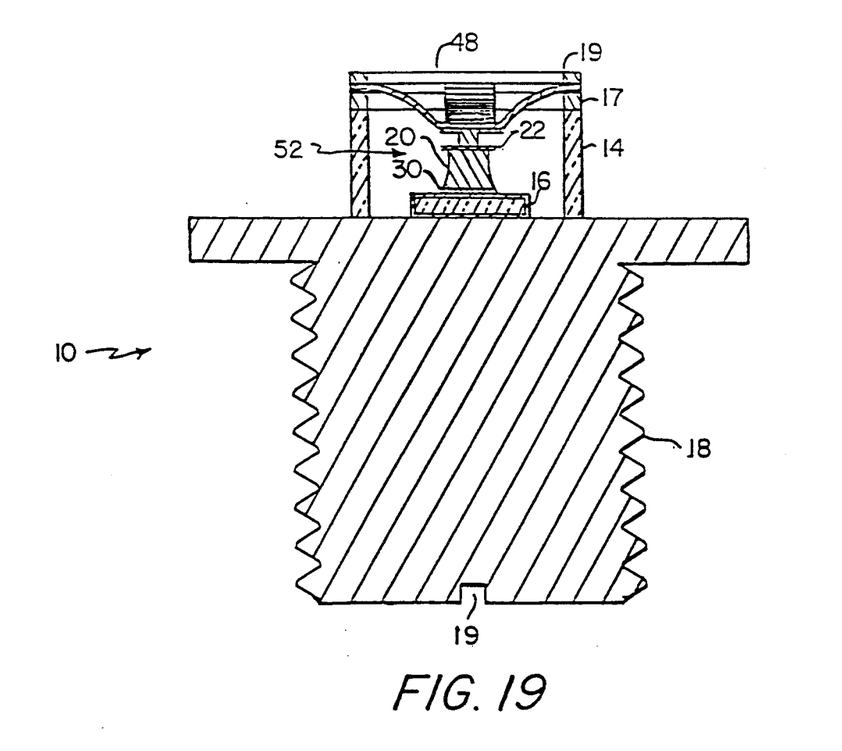
FIG. 19 is a cross sectional view of a single mesa diode device having a thin heat sink layer and beam leads, mounted in a ceramic ring package in accordance with the invention.

Referring now to FIG. 19, the single mesa diode device 52 having plated beam leads is here mounted in a package 10, as shown. The package 10 includes a conventional stub support 18 here of copper having a screw slot 19, for package mounting. The stub support 18 here supports a pedestal 16 which is here of gold plated diamond. The thickness of the gold plating on the diamond pedestal 16 is here 2 microns thick. Alternatively the pedestal 16 may be embedded in the stub support 18 or may be formed from the stub support 18. A conductive ring 17 here gold plated copper is spaced from the stub 18 by a insulating ring spacer 14. The insulating ring spacer 14 is here ceramic but may be quartz or any other suitable insulating material. The plated heat sink side of the diode 20 is here mounted to the pedestal 16 by a thermal compression bond. Mounting the diode 88 to the pedestal 16 causes the beam leads 48 to bend upward and extend up toward the edge of the conductive ring 17. Thermal compression bonds are here used to bond each of the beam leads to the conductive ring 17. A conductive lid 19 is then provided to add further support to the package 10. The lid 19, here gold plated copper is thermal compression bonded to the conductive ring 17 and may form a hermetic seal between ring 17 and lead 19. This structure provides a package 10 wherein a diode 20 having extended beam leads 48 as top electrodes, which are bonded to the conductive ring 17 using a thermal compression bond on the plated leads, without having to bond a lead to the diode mesa itself. Diode package 10 should have lower parasitic capacitance and inductance than other diode packages, thus enhancing the diode's electrical characteristics.

Figure 20:
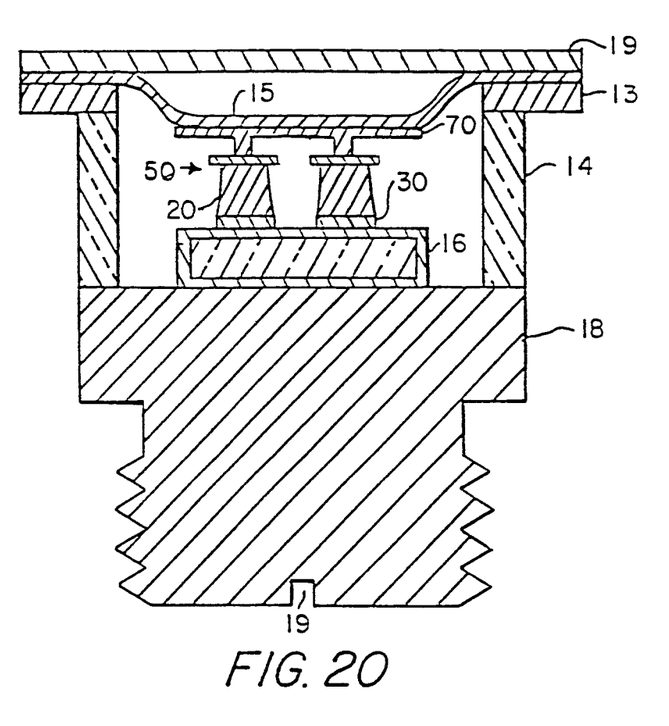
FIG. 20 is a cross-sectional view of a multimesa diode device having a thin heatsink and overlays mounted in a ceramic ring package in accordance with the invention.

Referring now to FIG. 20, a multi-mesa diode device 50 interconnected by an overlay pattern is package in a diode package 90 as shown. The package 90 includes a conventional stub support 18 here of copper having a screw slot 19, for package mounting. The stub support 18 here supports a pedestal 16 which is here of gold plated diamond. Alternatively, the pedestal 16 may be embedded in the stub support 18 or may be formed from the stub support 18. A conductive flange 13 here gold plated copper is spaced from the stub 18 by an insulating ceramic ring spacer 14. The insulating ring spacer is here ceramic buy may be quartz or any other suitable insulating material. The plated heatsink side of the multimesa diode device 50 is here mounted to the pedestal 16 by a thermal compression bond. A gold ribbon strip 15 is then thermally compression bonded to the conductive flange 13 and the overlay 70. A conductive lid 19 is then provided to add further support to the package 10. The lid 19, here gold plated copper is thermal compression bonded to the conductive flange 13 and may form a hermetic seal between flange 13 and lid 19.

From the foregoing, it will be apparent that all of the objectives of this invention have been achieved by the structures shown and described herein. It also will be apparent, however, that various changes may be made by those skilled in the art without departing from the spirit of the invention as expressed in the appended claims. It is to be understood, therefore, that all matter shown and described herein is to be interpreted as illustrative and not in a limiting sense.

What is claimed is:

1. A semiconductor structure comprising:
   a support layer having a plurality of apertures therein;
   a heat conductive layer disposed on the support layer; and
   a plurality of semiconductor elements disposed on the heat conductive layer and disposed over the support layer with the support layer supporting the heat conductive layer and the semiconductor elements and, with at least one of such elements being disposed over a corresponding one of the plurality of apertures in said support layer.

2. A semiconductor structure as recited in claim 1 further comprising:
   a plurality of electrodes, each one of such electrodes being coupled to at least one of such elements.

3. A semiconductor device comprising:
   a plurality of semiconductor elements;
   a support layer having a plurality of apertures therein; and
   a heat conductive layer disposed over the support layer having a thickness of about 1 to 2 microns with at least some of the plurality of semiconductor devices being coupled to the thermally conductive layer in at least a region of the heat conductive layer disposed over one of the apertures in the support layer.

4. A semiconductor device comprising:
   a plurality of semiconductor elements;
   a support layer having a plurality of aperture therein;
   a heat conductive layer disposed between the support layer and the plurality of semiconductor elements; and
   wherein portions of the heat conductive layer are disposed over the apertures, and at least one of such plurality of semiconductor elements is disposed over the heat conductive layer and the support layer.

5. A semiconductor device comprising:
   a support layer having a plurality of apertures;
   a heat conductive layer having a thickness of 1 to 2 microns disposed on the support layer;
   a plurality of clusters of semiconductor element disposed on the support layer with each cluster disposed over a corresponding aperture in the support layer; and
   a plurality of top electrodes, each one of such electrodes being coupled to a corresponding one of such clusters of semiconductor elements.

* * * * *